United States Patent [19]

Hochwald et al.

[11] Patent Number: 5,039,876
[45] Date of Patent: Aug. 13, 1991

[54] RADIATION HARDENED BISTABLE LOGIC CIRCUIT

[75] Inventors: Walter Hochwald, Irvine; David L. Rusher, Costa Mesa; Michael A. Kreidt, Placentia, all of Calif.

[73] Assignee: Rockwell International Corporation, El Segundo, Calif.

[21] Appl. No.: 594,911

[22] Filed: Oct. 9, 1990

[51] Int. Cl.⁵ ............................................. G11C 11/40
[52] U.S. Cl. .................................. 307/278; 307/443; 307/272.2; 307/291; 307/308
[58] Field of Search ..................... 307/443, 272.2, 291, 307/308, 441, 219

[56] References Cited

U.S. PATENT DOCUMENTS

| | | | |
|---|---|---|---|
| 3,731,119 | 5/1973 | Matzer | 307/296.4 |
| 3,833,824 | 9/1974 | Parks | 307/308 |
| 4,130,892 | 12/1978 | Gunckel, II et al. | 307/279 |
| 4,418,402 | 11/1983 | Heagerty et al. | 307/279 |
| 4,782,467 | 11/1988 | Belt et al. | 307/279 |

*Primary Examiner*—David Hudspeth
*Assistant Examiner*—Scott A. Ouellette
*Attorney, Agent, or Firm*—H. Fredrick Hamann; George A. Montanye; Wilfred G. Caldwell

[57] ABSTRACT

The invention is a radiation hardened bistable logic circuit employing two pairs of parallelly connected transistors, cross coupled through diode "OR" circuits, with back-to-back diodes between the gates or bases of the two FETs or bipolar transistors comprising each pair.

5 Claims, 5 Drawing Sheets

RADIATION HARDENED BISTABLE LOGIC CIRCUIT

This invention was made with Government support under Contract No. F04704-84-C-0061 awarded by the Air Force. The Government has certain rights in this invention.

BACKGROUND OF THE INVENTION

1. Field of the Invention

The present invention hardens latch or bistable logic circuits against single event upset.

2. Prior Art

The problem of high energy ionizing particle induced upset, or as it is commonly called, single event upset (SEU), encompasses a large, and constantly growing body of knowledge covering the origins and properties of high energy ionizing particles and their effects upon device physics. Interest in this subject has been motivated by numerous space and defense applications. For example, SEU's are a common occurrence in small geometry devices exposed to the heavy ions and protons in the Van Allen belts, and to solar flares and galactic cosmic rays outside the earth's atmosphere.

High energy ionizing particles passing through the volume of a logic cell produces a transient charge along the ion track. The diameter of this transient charge region can be from less than 1 micron to as large as 5 or 6 microns, depending on high energy particle type and substrate doping. The free electrons produced along the ion track either recombine with the holes in the substrate, or, if the track passes through a p-n junction they will collect to produce a transient current spike. The high density of these charge carriers can significantly influence charge carrier distribution in the junction for the duration of this spike. Depending on ionizing particle type and substrate doping, these current spikes can reach magnitudes up to 1000 microamps and durations of up to 1 or 2 nanoseconds. Clearly, they can cause the critical charge of a back-biased logic junction to be exceeded, which in turn can change the state of a bistable logic element. Such errors have been observed in space vehicle applications of RAMs, microprocessors, PROMs and logic devices. While some permanent failures have been reported, possibly due to latch-up in certain devices, the majority of faults are "soft," i.e., a logic state change occurs without permanent damage.

The SEU problem is becoming increasingly important as chip designs approach submicron feature sizes. For example, bipolar logic circuits in this region operate with collector currents on the order of 1 microamp, and clock rates on the order of 50 to 100 megahertz. Since the current spikes generated by heavy high energy particles can reach levels up to 1000 microamps and pulse widths of up to 1 or 2 nanoseconds, they are directly within the response range of these bipolar logic circuits which may be clocked in normal operation by pulse width of less than 5 nanoseconds.

CMOS/SOS technology is inherently less sensitive to the currents generated by high energy ionizing particles. However, computer simulations with postulated parameters at submicron feature sizes also indicate logic state changes when critical junctions are subjected to 1000 microampere pulses of 1 nanosecond duration. In fact, as feature size decreases the CMOS/SOS and bipolar technologies tend to display comparable sensitivities.

Achievement of hardened circuits, therefore, appears virtually impossible at first glance. However, a novel circuit configuration has been devised, which provides the necessary hardness by virtue of its functional arrangement (local redundancy) and isolation protection and is independent of device technology.

SUMMARY OF THE INVENTION

The radiation hard bistable logic circuits of the invention comprise first and second pairs of transistors substantially connected in parallel and cross coupled through diode OR circuits, such that when one pair of transistors is in a first logic state, the other pair is in a second logic state. A pair of back-to-back diodes is connected between each pair of transistors so that the diodes in the OR circuits and between the pairs prevent single event upset of the logic state of each pair when one transistor of a pair is hit by external radiation, even though its logic state may be temporarily affected.

The transistors may be bipolar or field effect transistors and are usually implemented as VHSIC very high speed integrated circuits.

DETAILED DESCRIPTION OF THE PREFERRED EMBODIMENTS OF THE PRESENT INVENTION

Figure 1:
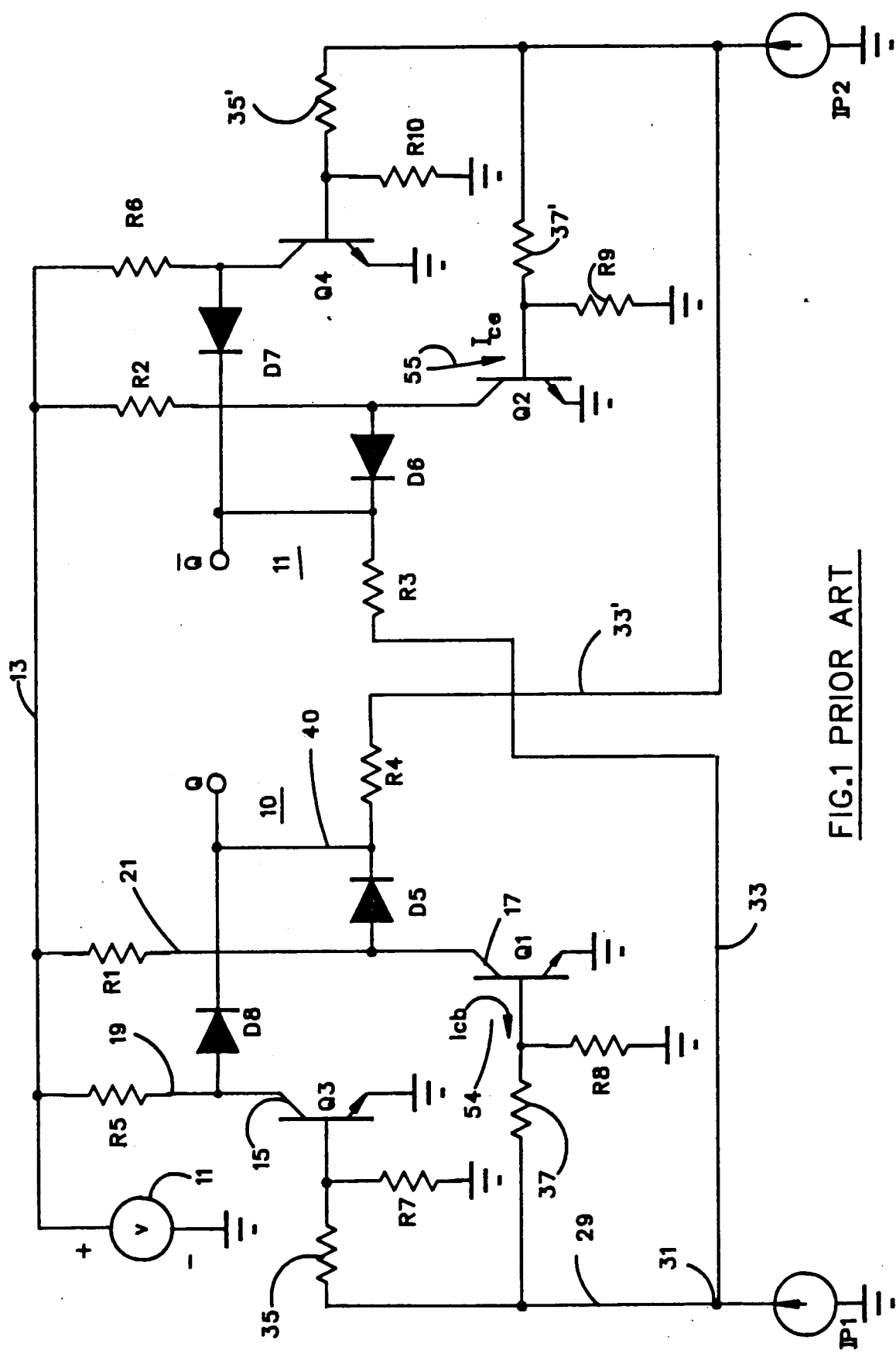
FIG. 1 is a somewhat hardened bistable logic circuit using resistors to tie the bases of bipolar transistor pairs.

In the proposed bistable circuit of FIG. 1, Q1 and Q3 comprise one pair of bipolar transistors, whereas Q4 and Q2 comprise the other pair of bipolar transistors. Each pair normally exhibits the same logic level, i.e., logic 1 on one side and the other pair exhibits a logic 0 on the other side. Current sources IP1 and IP2 are shown to indicate signals which will set this bistable circuit to change the output levels at Q and $\overline{Q}$ in normal operation. The DC power source V, shown at 11, applies positive 5 volts to common lead 13. The collectors 15 and 17 of Q3 and Q1 are connected over leads 19 and 21 to the common positive lead 13 by way of transistor load resistors R5 and R1, respectively. All transistors are made by conventional integrated circuit processes.

The input circuit for transistors Q1 and Q3 comprises lead 29, extending from the junction 31 of current source IP1 and cross coupling lead 33, to input resistors 35 and 37 for Q3 and Q1, respectively.

The output of the parallel connected transistors Q1 and Q3 comprises diode D8, connected to collector lead 19 for transistor Q3, and diode D5 connected to collector lead 21 for transistor Q1. The "OR gate" lead 40 connects diode D8 to diode D5 and the output extends through resistor R4 to the other cross coupling lead 33'.

The right hand side of the circuit corresponds precisely to the left hand side just described to comprise a bistable logic circuit, operable in conventional fashion, but hardened by the OR gate output circuits and semi hardened by the resistors 37 and 37'. Resistors 35, 37, 37' and 35' are 1000 ohm resistors.

It is apparent that both Q1 and Q3 are at the same level which may be, for example, a logic 1, and Q4 and Q2 are at the different level, namely logic 0, until switched.

In the event of an external radiation influence, the resistors 35, 37, 35' and 37' do not block the $I_{ce}$ and the $I_{cb}$ for any transistor struck so its paired transistor is affected.

Figure 2A:
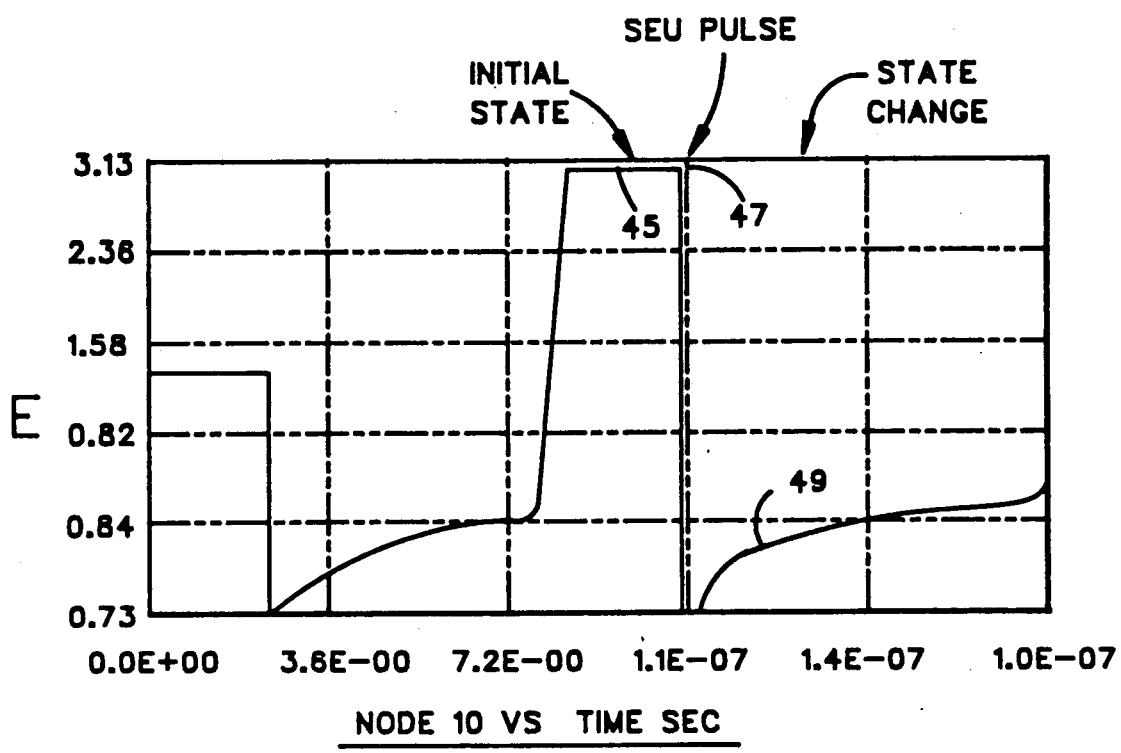
FIGS. 2a and 2b show a REDAC (Rockwell Electronic Design Analysis Code) simulation which shows no SEU recovery with FIG. 2a showing a state change at node 10 in response to external radiation for the circuit of FIG. 1, and FIG. 2b showing the effects at node 11.
Figure 2B:
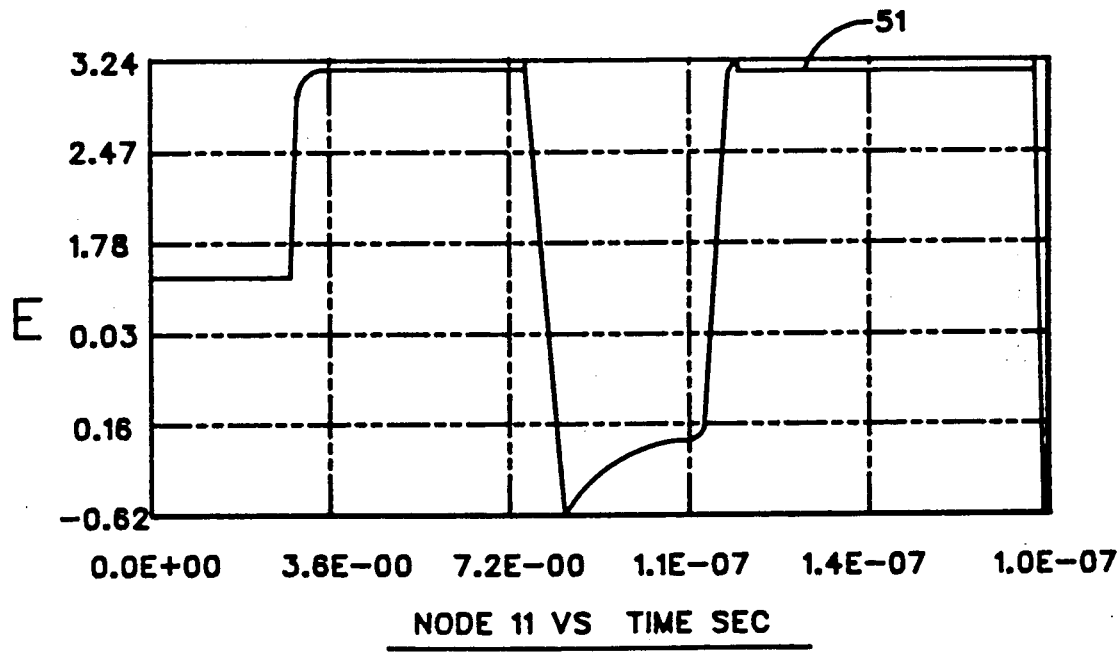

FIGS. 2a and 2b represent the performance of the circuit of FIG. 1 at node 10 (above) and node 11 (below). The REDAC simulations, performed for the circuit of FIG. 1, show SEU recovery at 10 megahertz using 1 miliampere, 1 nanosecond SEU pulse, occurring at the collector base junction of Q1, at 110 nanoseconds from the start of the simulation. Node 10 (FIGS. 1 and 2a) is latching a logic 1, as can be seen by the 3.13 volt level initial state 45 in FIG. 2. The SEU pulse is applied at time 47 and the logic drops to the 0.04 volt level (to level at 49) to indicate a change of state from logic 1 to logic 0. Also, as would be expected, the node 11 chart FIG. 2b, shows a reversal of the logic state for transistors Q2 and Q4 to logic 1, as seen at 51.

The circuit of FIG. 1 does not protect against the current $I_{cb}$, shown at 54 in FIG. 1, because the resistor 37 does not isolate this current from the gate of transistor Q3. Similarly, the current $I_{ce}$, shown at 55 for Q2, is not isolated by resistor 37'.

However, it was noted that this circuit will recover from very low SEU pulses (16 microampere pulses) if large enough resistors are used but the resistors must be increased to the point that the circuit does not really function properly.

Figure 3:
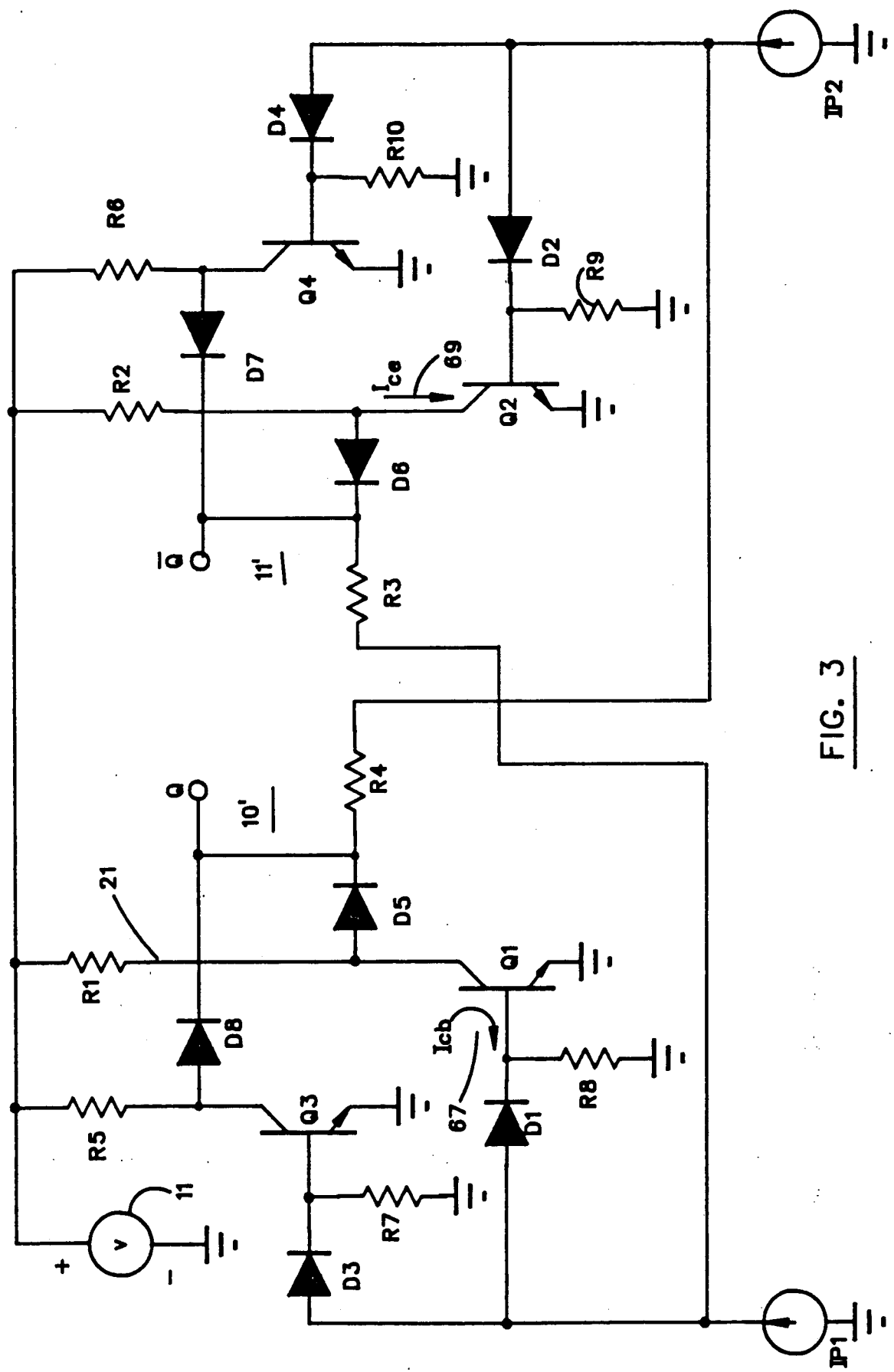
FIG. 3 illustrates a preferred embodiment of the circuit of the present invention using bipolar transistors and wherein diodes replace the input resistors in order to isolate the bases rather than tie them together.

This situation is remedied and further improved by the bipolar bistable logic circuit of FIG. 3 wherein diodes D1 and D3 replace input resistors 37 and 35 of FIG. 1 and dioies D2 and D4 replace input resistors 37' and 35' of FIG. 1. These are respectively back-to-back diode pairs which isolate the gates of each pair of transistors Q1, Q3 and Q2, Q4. These diodes are characterized by a breakdown voltage of 10 volts, a saturation current of $10^{-17}$ amperes, bulk resistance of 300 ohms, leakage resistance of $1 \times 10^9$ ohms, recovery time of 1 nanosecond and 0.002 picofarad junction capacitance, and may be conventionally processed.

In this circuit, by way of example, collector resistors R5, R1, R2 and R6 are 2.5 megohms. The Q3 and Q4 base resistors R7 and R8 are 10 megohms, as are corresponding resistors R10 and R9. Cross coupling resistors R3 and R4 are 2.5 megohms, and all diodes may be characterized the same.

Figure 4A:
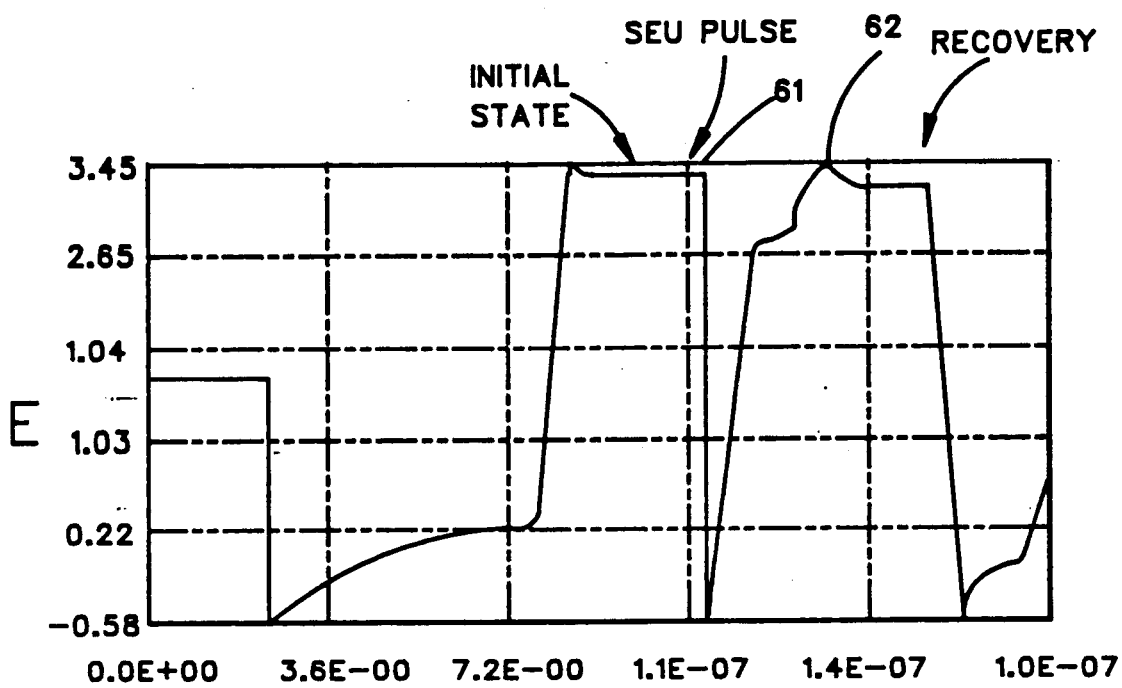
FIG. 4a and 4b show the SEU effects at nodes 10' and 11' for the circuit of FIG. 3 indicating rapid recovery and no permanent change of state at node 10'; and, FIG. 5 is a further preferred circuit embodiment of the hardened logic circuit utilizing FETs and back-to-back diodes in lieu of bipolar transistors and back-to-back diodes.
Figure 4B:
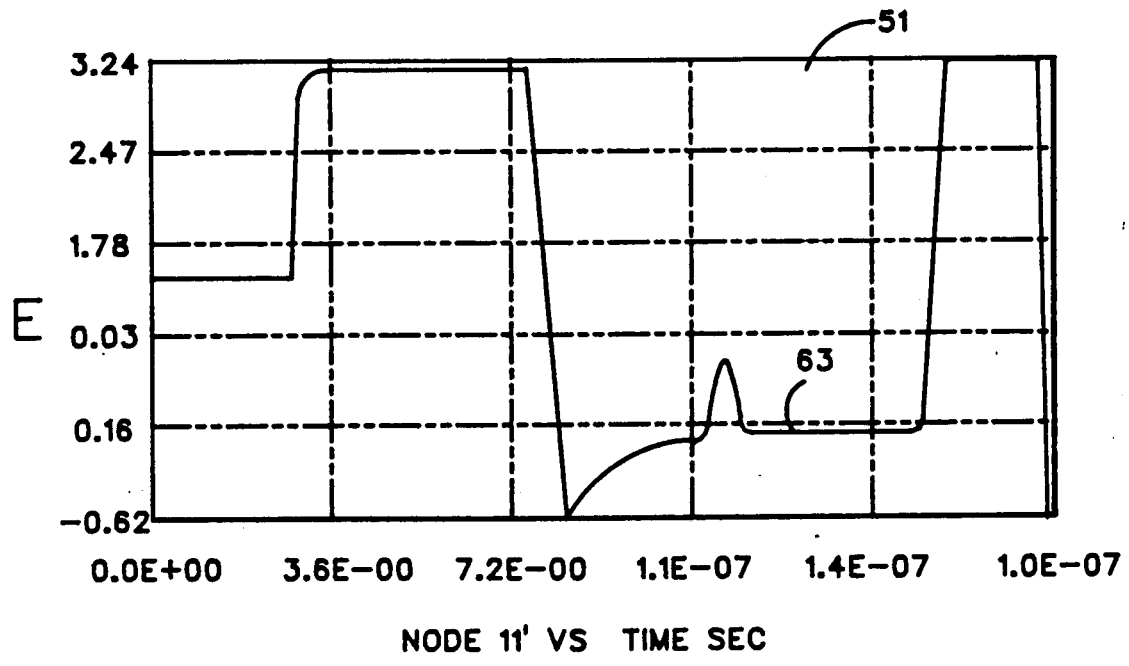

FIGS. 4a and 4b shows the results of the application of a 1 miliampere, 1 nanosecond SEU pulse to the collector-base junction of Q1 of FIG. 3 at 110 nanoseconds from the start of the simulation. Nodes 10' and 11' are the outputs of the latch of FIG. 3. Note that the outputs recover (go back to their original state) shortly after the SEU event. Thus, the SEU pulse was applied to Q1 at time 61 and the left hand logic 1 was totally recovered by time 62 (see FIG. 4a). Simultaneously, the output of the right hand side remained low at 63 (FIG. 4b). Thus, the latch gave no false indications of the logical storage due to the external radiation.

Also, it will be seen from FIG. 3 that the current $I_{cb}$ 67 is now blocked because it cannot flow through diode D1. Similarly, the current $I_{ce}$, shown at 69, is blocked by D2 from upsetting Q4.

Figure 5:
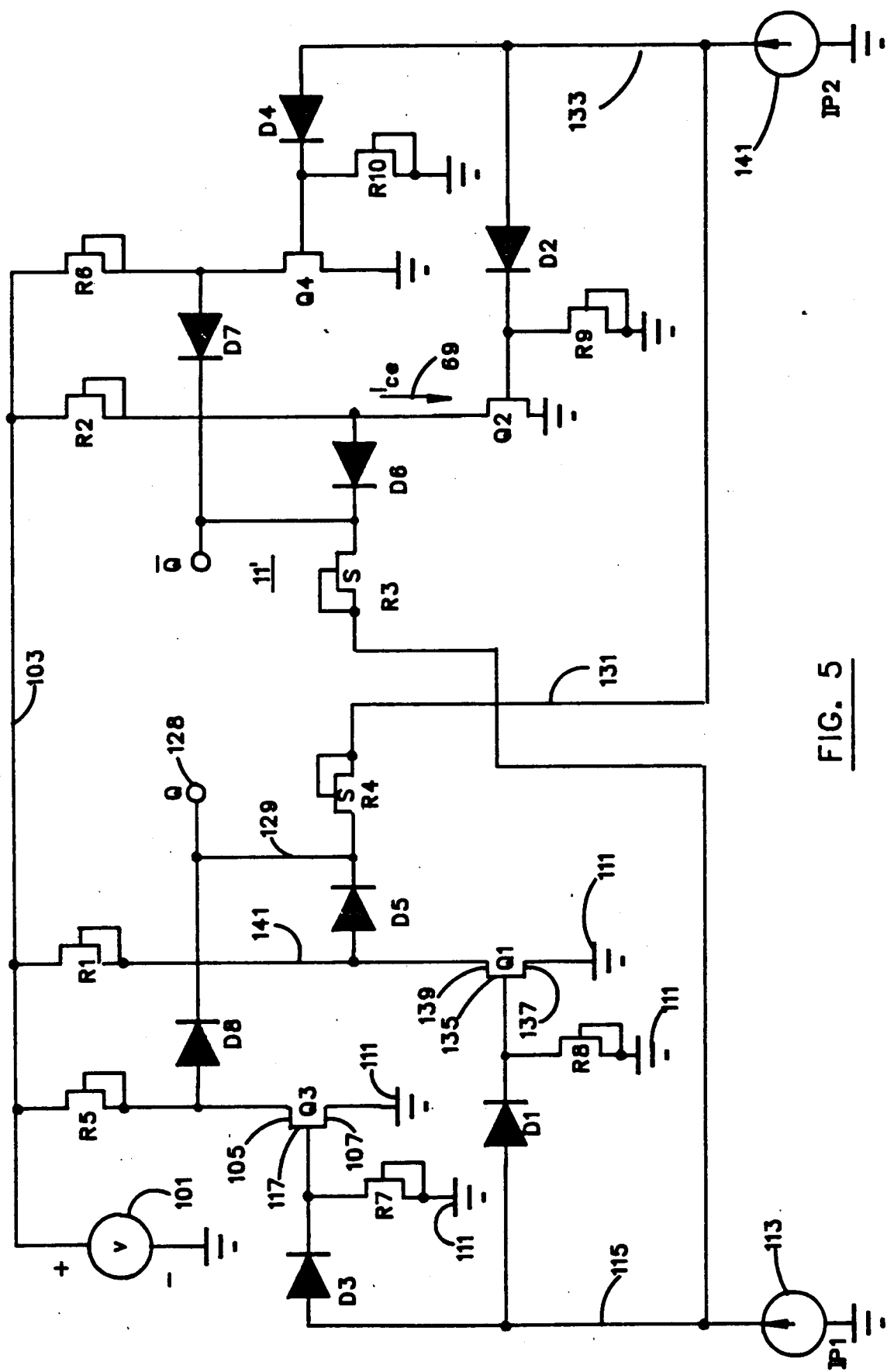

FIG. 5 is a logic circuit which also employs Applicant's preferred back-to-back diode isolation means. It includes a pair of FET transistors, Q1 and Q3, on one side of this bistable logic circuit and another pair of FET transistors, Q2 and Q4, on the other side of the bistable logic circuit. A 5 volt source 101 applies positive voltage to common lead 103, thereby energizing Q3 drain 105 by way of 2.5 megohm transistor resistor R5, with the source 107 tied to ground 111. This transistor has an input circuit from current generator 113 (IP1) by a lead 115 and diode D3 to gate 117, 10 megohm gate resistor R7 extending from the gate 117 to common ground 111. The output of this circuit is taken from drain 105, by way of diode DB to Q output terminal 128, and thence, via OR lead 129 and 2.5 megohm resistor R4 to cross coupling lead 131 which extends to the input lead 133 for the Q2 and Q4 circuits.

Returning to the left hand side of the circuit, the FET transistor Q1 is similarly connected from its input lead 115 via input diode D1 to gate 135 with the gate resistor R8 of 10 megohms being connected to common ground 111 and source 137 of Q1 being connected to ground 111. Its drain 139 is connected over lead 141, and resistor R1 of 2.5 megohms, to the common positive lead 103.

Its output extends over diode D5 and common resistor R4 of 2.5 megohms to the cross coupling lead 131. It should be noted that diodes D8 and D5, together with resistor R4, constitute an OR circuit connected as the output of these two transistors to cross coupling lead 131.

The other pair of FET transistors, namely Q2 and Q4, are connected in exactly the same manner as Q1 and Q3 and operate in the same manner as Q1 and Q3.

The input lead 133 extends from current source 141 such that the transition between conducting pairs may be determined in accordance with the signal output at 113 and 141.

It is apparent that both Q1 and Q3 are at the same level which may be, for example, a logic 1, and Q4 and Q2 are at the different level, namely logic 0, until switched.

In the event of an external radiation influence, the back-to-back diodes block the $I_{ds}$ and the $I_{dg}$ for any paired transistor struck so its paired transistor is not affected.

Also, the preferred embodiments prevent logic upset due to SEU currents at any of the diodes.

What is claimed is:

1. A radiation hard bistable logic circuit comprising, in combination:
   a first pair of transistors connected in parallel and having input and output means;
   a second pair of transistors connected in parallel and having input and output means;
   the input means for each pair comprising a common input signal connection respectively for the transistors of each pair of transistors;
   a branch connection from the common connection for each pair of transistors to the respective transistors of each pair;

a diode connected in each branch connection and oriented to block current attempting to flow from each transistor toward the diode in its branch connection thereby precluding either transistor of each pair from influencing the other transistor of each pair due to radiation affecting any transistor of each pair; said diodes of each pair of transistors being thereby connected back to back;

the output means comprising a diode in circuit with each transistor with the diodes of each pair of transistors being connected together as an OR circuit in turn connecting the OR output to the common input connection of the other pair of transistors for maintaining the logic state of the pair of transistors in which one transistor is temporarily affected by radiation, whereby when one pair of transistors is in a first logic state being on, the other pair is in a second logic state being off and vice versa.

2. A radiation hard bistable logic circuit comprising, in combination:

a first pair of transistors connected in parallel and having input and output means;

a second pair of transistors connected in parallel and having input and output means;

the output means of the first pair being connected to the input means of the second pair and the output means of the second pair being connected to the input means of the first pair whereby when one pair of transistors is in a first logic state being on, the other pair is in a second logic state being off and vice versa;

each of said input means comprising a pair of diodes connected back to back between the respective transistors of each pair to prevent logic upset of any transistor paired with a transistor whose logic state is temporarily altered by radiation;

the output means of each pair comprises an OR circuit for maintaining the lock state of the pair of transistors in which one transistor is temporarily affected by radiation;

each of said OR circuits comprises a diode connected in the output of each transistor and a resistor connected in series with said diodes; and at least the back to back diodes are characterized by a breakdown voltage of about 12 volts, and a saturation current of approximately $10^{-17}$ amperes.

3. The circuit of claim 1, wherein:
the transistors of the first and second transistor pairs are FETs, and said back-to-back diodes are connected directly between the gates of each transistor pair.

4. The circuit of claim 1, wherein:
the transistors of the first and second transistor pairs are bipolar transistors, and the back-to-back diodes are connected between the bases of each transistor pair.

5. The circuit of claim 2, wherein:
the circuit parameters will accommodate a 1 milliampere, 1 nanosecond single event upset pulse without experiencing a permanent change in logic state of the transistor pairs.

* * * * *

UNITED STATES PATENT AND TRADEMARK OFFICE
CERTIFICATE OF CORRECTION

PATENT NO. : 5,039,876

DATED : August 13, 1991

INVENTOR(S) : Walter Hochwald et al.

It is certified that error appears in the above-identified patent and that said Letters Patent is hereby corrected as shown below:

In Claim 2, column 6, line 7, please change "lock" to read --logic--.

Signed and Sealed this

Twelfth Day of January, 1993

Attest:

DOUGLAS B. COMER

*Attesting Officer*   Acting Commissioner of Patents and Trademarks